United States Patent [19] [11] 4,353,777
Jacob [45] Oct. 12, 1982

[54] SELECTIVE PLASMA POLYSILICON ETCHING

[75] Inventor: Adir Jacob, Framingham, Mass.

[73] Assignee: LFE Corporation, Clinton, Mass.

[21] Appl. No.: 255,495

[22] Filed: Apr. 20, 1981

[51] Int. Cl.$^3$ .......................................... H01L 21/306
[52] U.S. Cl. ..................... 156/643; 156/646; 156/657; 156/659.1; 156/345; 204/192 E; 204/298; 252/79.1
[58] Field of Search ............... 156/643, 646, 657, 662, 156/659.1, 345; 204/192 E, 164, 192 EC, 298; 427/38, 39; 252/79.1

[56] References Cited

U.S. PATENT DOCUMENTS

| Re. 30,505 | 2/1981 | Jacob | 156/643 |
|---|---|---|---|
| 3,654,108 | 4/1972 | Smith, Jr. | 204/164 |
| 3,806,365 | 4/1974 | Jacob | 134/1 |
| 3,880,684 | 4/1975 | Abe | 156/8 |
| 3,940,506 | 2/1976 | Heinecke | 427/38 |
| 3,951,709 | 4/1976 | Jacob | 156/8 |
| 3,951,843 | 4/1976 | Jacob | 252/187 R |
| 3,975,252 | 8/1976 | Fraser et al. | 204/192 |
| 3,984,301 | 10/1976 | Matsuzaki et al. | 204/192 |
| 4,028,155 | 6/1977 | Jacob | 156/643 |
| 4,066,037 | 1/1978 | Jacob | 118/49.1 |
| 4,069,096 | 1/1978 | Reinberg et al. | 156/643 |
| 4,073,669 | 2/1978 | Heinecke et al. | 156/643 |
| 4,094,732 | 6/1978 | Reinberg | 156/643 |
| 4,123,564 | 10/1978 | Ajima | 427/85 |
| 4,123,663 | 10/1978 | Horiike | 250/531 |
| 4,148,705 | 4/1979 | Battey et al. | 204/192 E |
| 4,162,185 | 7/1979 | Coburn et al. | 156/643 |
| 4,162,210 | 7/1979 | Deppe | 204/192 |
| 4,180,432 | 12/1979 | Clark | 156/643 |
| 4,182,646 | 1/1980 | Zajac | 156/643 |
| 4,188,426 | 2/1980 | Auerbach | 427/40 |
| 4,190,488 | 2/1980 | Winters | 156/643 |
| 4,203,800 | 5/1980 | Kitcher et al. | 156/643 |
| 4,209,356 | 6/1980 | Stein | 156/643 |
| 4,213,818 | 7/1980 | Lemons et al. | 156/643 |
| 4,214,946 | 7/1980 | Forget et al. | 156/643 |
| 4,229,247 | 10/1980 | Chiu et al. | 156/643 |
| 4,233,109 | 11/1980 | Nishizawa | 156/643 |
| 4,253,907 | 3/1981 | Parry et al. | 156/643 |
| 4,255,230 | 3/1981 | Zajac | 156/643 |
| 4,298,443 | 11/1981 | Maydan | 204/192 |

OTHER PUBLICATIONS

Japan. J. Appl. Phys. Suppl. 2, Pt. 1, 1974, RF Sputter–Etching by Fluoro-Chloro-Hydrocarbon Gases by Hosokawa et al., pp. 435–438.
LFE Corporation, Plasma Systems, Bulletin 8277-PB1 dated Feb. 1979.

Primary Examiner—William A. Powell
Attorney, Agent, or Firm—Kenway & Jenney

[57] ABSTRACT

A process for etching polysilicon material preferentially over silicon oxide. The process is anisotropic and employs a moderate to low pressure of Freon 11 (CFCl$_3$) in an RF plasma discharge. In a second embodiment helium is mixed with the Freon 11 to inhibit degradation of the photoresist mask.

6 Claims, 1 Drawing Figure

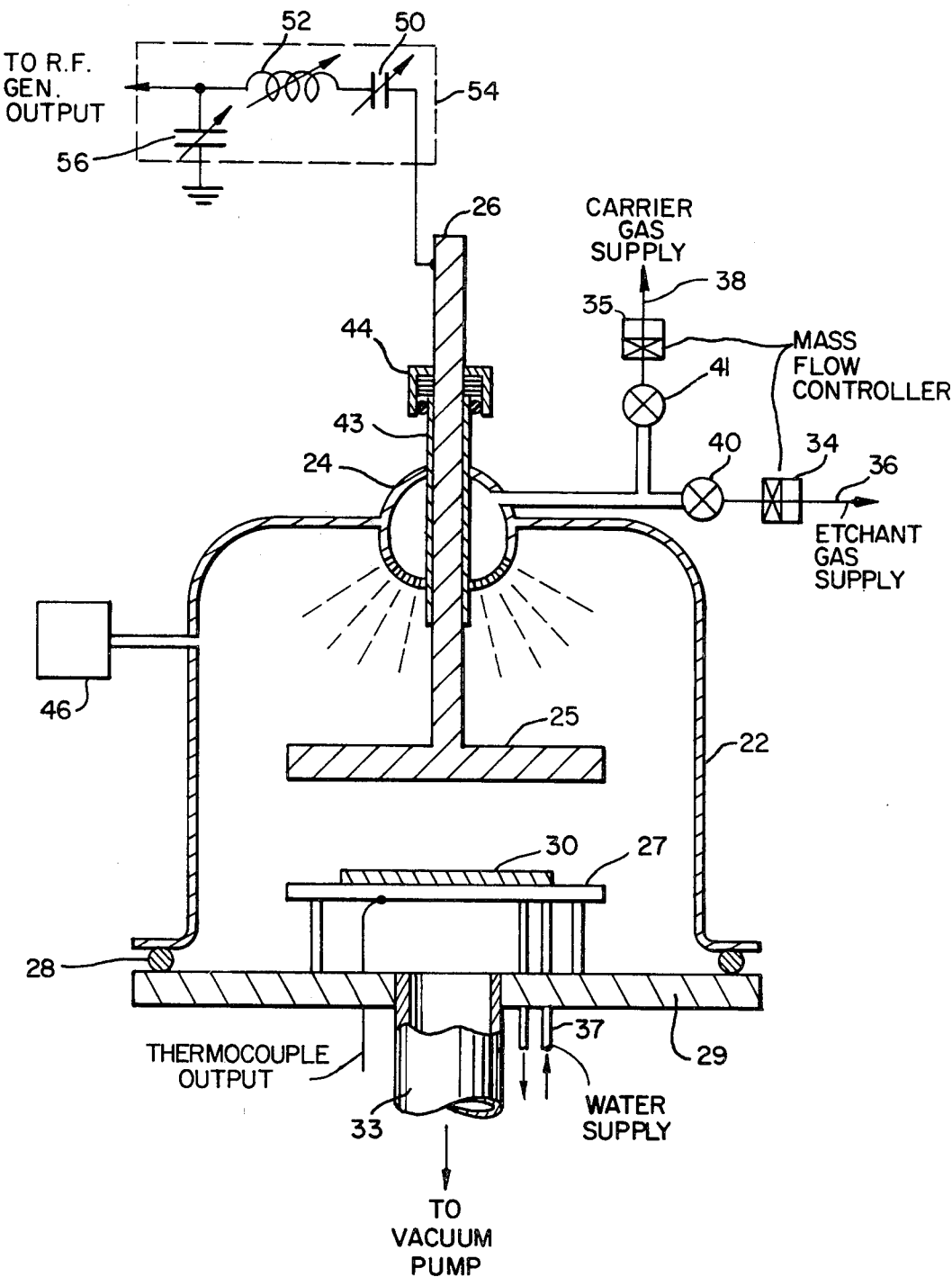

SELECTIVE PLASMA POLYSILICON ETCHING

FIELD OF THE INVENTION

This invention relates in general to fabrication of semiconductors and more particularly to a plasma etching technique for etching of polycrystalline silicon (polysilicon).

BACKGROUND OF THE INVENTION

The manufacturing of semiconductor devices and related thin film circuitry usually involves etching of specific layers comprising the device. Typically, the area to be etched is masked by material such as photoresist with the mask forming a pattern of lines and areas exposing the layer to be etched. In earlier approaches, the etching was carried out by a wet chemical method in which the etchant material, typically oxidizing mineral acids, contacted the exposed surface.

More recent processes employ gas plasmas, particularly fluorine based gases selected from the saturated halocarbon series, which eliminate some of the undesirable effects of wet chemistry. However, in both methods the etching was basically isotropic. With isotropic etching random etching proceeds at a uniform rate in all directions. As the surface to be etched is removed, the etching action takes place not only vertically into the surface, but also horizontally against the edge of the recess created by the etching. Thus, the area to be etched suffers undercutting in which the material is etched not only vertically in line with the edge of the opening in the photoresist mask, but also it extends underneath the photoresist mask. Typically this undercutting extends horizontally in substantially the same degree as the vertical etching.

As the trend toward miniaturization continues, scaling down to the micron and submicron dimension regions becomes a reality. This imposes strict demands on etch profiles, characteristically in the direction of vertical etch profiles with insignificant undercutting. This mode of plasma etching, commonly referred to as anisotropic etching, is the result of directional effects that suppress isotropic etching. Ideally, it provides for a vertical etch wall on a plane closely approximating that delineated by the resist edge prior to the etching operation.

As techniques of lithography improve, line patterns of micron and submicron dimensions in photoresist images become possible. In order to effectively transfer these images to the various substrates, reliable, reproducible anisotropic etching is necessary. In the past, in order to compensate for the undercutting effect of isotropic etching, the line width in the mask was made narrower than the desired line width in the layer to be etched, anticipating the widening of the line resulting from undercutting. With the demand for much smaller dimensions of line width and spaces, the lack of control and reproducibility resulting from undercutting, has made isotropic etching unacceptable.

Other prior art techniques have employed reactive ion etching performed at low pressure. However, while this technique can produce some anisotropically etched structures with some selectivity, there is considerable uncertainty as to radiation damage due to the highly energetic incident ion flux.

Another problem associated with very large scale integrated silicon circuits (VLSI) is the desirability that there be a reasonably high selectivity in the etch rate of polysilicon with respect to the etch rate of the underlying silicon oxide to provide enough control during the etching for the preservation of thin and ultrathin silicon oxide dielectric underlayers in field effect devices.

It is therefore a primary object of the present invention to provide a plasma etching technique for utilization during semiconductor fabrication in which highly efficient polysilicon etching takes place with a high degree of selectivity with respect to the etching of silicon oxide, and wherein highly anisotropic etching takes place to provide substantially vertical profiles in the features etched in the polysilicon layer, where the removal process is primarily due to chemical interactions and is void of adverse radiation damage effects.

SUMMARY OF THE INVENTION

Broadly speaking, in the present invention, the gas plasma consists essentially of RF-discharged Freon 11 ($CFCl_3$) employed at moderate to low pressures, typically 100 micron Hg, for highly efficient and uniform anisotropic etching of polysilicon. The process is highly selective for polysilicon with respect to silicon oxide and produces substantially vertical etched profiles for features in the range of submicron to a few microns (typically one to four microns). In one embodiment the addition of helium gas to Freon 11, to form a binary gaseous mixture before the discharge, beneficially affects the photoresist mask during etching because of its high heat transfer property and the prevention of hot spot formation. This results in insignificant degradation of the photoresist during etching of polysilicon without significantly affecting the average etch rate of the polysilicon itself. This etching technique may be employed with both batch and in-line systems for the processing of semiconductor devices and is also suitable for etching of metal silicides overcoating polysilicon. Silicides of titanium, tantalum, molybdenum and tungsten are good candidates for such a process.

DESCRIPTION OF THE DRAWING

In the drawing,
FIG. 1 is an illustration in diagrammatic form of an apparatus suitable for use in the practice of this invention.

DESCRIPTION OF PREFERRED EMBODIMENTS

In the FIGURE there is illustrated an apparatus suitable for use in the process of the invention. The reactor chamber 22 is generally cylindrical in shape, is typically formed of quartz or other type of suitable glass and is sealed through O-ring 28 to a base plate 29, which would usually also be formed of quartz. At the top of reaction chamber 22 a coaxial gas dispersion jet arrangement 24 allows gas to enter the reaction chamber. A generally disk shaped and temperature controlled water cooled electrode 25 is carried on a supporting rod 26 and is adjustably positioned from the top of the reactor through electrode guide 43 and frictional coupling 44. A suitable material for this electrode 25 is aluminum. The semiconductor material to be treated 30 is placed on a water cooled and temperature controlled table 27 with water supplied through tubing 37. An opening 33 in the base plate 29 provides for a vacuum pump to be coupled to the interior of the reaction chamber 22 via an automatic throttle control valve (not shown). Fill gas to the reactor is supplied through a pair of valves 40 and 41. Valve 40 is supplied gas from an etchant gas supply 36 through a mass flow controller 34. A carrier gas supply 38 is coupled through a second mass flow controller 35 and valve 41. The pressure in the chamber is measured by any conventional pressure gauge such as an electric capacitance manometer 46. RF energy is coupled from an RF generator (not shown) through coupling circuit 54 to the electrode 25. The RF generator would typically have a frequency of 13 mHz and a variable power output. Suitable dimensions for the electrode are a 4½ inch diameter disk with a spacing of 1.25 inches between the disk and the semiconductor substrate to be treated.

OPERATION

The substrates to be etched, which typically have a thin layer of silicon oxide overlaid with a layer of polysilicon, are placed on the cooled substrate table 27, which could be maintained at ground potential. The polysilicon layer is commonly phosphorus-doped to a sheet resistance in a range of ten to twenty ohms per square. The silicon oxide underlayer is commonly thermally grown and densified. The polysilicon was patterned with a Shipley 1350 J photoresist and soft baked. The reactor 22 is evacuated to a base pressure of approximately five to fifteen microns Hg, at which point the etchant, with or without helium gas, is introduced. When the appropriate pressure of the etchant gas was obtained, the RF discharge was initiated and the etching reaction was commenced and allowed to proceed to completion. The etching end point for completion was determined visually by observing the disappearance of interference fringes associated with the polysilicon layer. When the end point was reached, the discharge and gas flow were stopped and the system was allowed to pump back to the base pressure. At this point the reactor was backfilled with Argon and the sample was withdrawn.

After the sample was withdrawn, the device pattern, for which the width of lines and spaces had been measured prior to etching, was re-examined after removal of the photoresist to determine the dimensional control during etching. These comparative measurements yielded data pertaining to etching resolution that could be accomplished with this process. In other experiments, etch profiles were examined after etching, but before photoresist was removed, by cleaving the sample and examining it with a scanning electron microscope.

cally for Freon 11. Additionally, corresponding etch rate uniformity on three inch diameter wafers was observed to lie within the range three to five percent.

With Freon 11, undercut values in the range of 0.05 to 0.1 microns on a side were observed, utilizing scanning electron micrographs.

When the etchants were employed with helium gas in the partial pressure range of 150 to 500 microns Hg, only a slight drop in the average etch rate of approximately seven to fifteen percent, as compared to the values without helium, were determined. Again, the smallest drop in etch rate was observed for Freon 11. With the helium carrier gas added, the photoresist integrity was improved and the anisotropy was substantially unaffected. Substantially anisotropic profiles were obtained with all three etchants, however.

While the invention has been described in conjunction with a specific apparatus, it will be understood that a variety of reactors, some of which are commercially available may be employed satisfactorily. Different etching modes, including physically-based concepts like reactive ion etching, reactive sputter etching, or reactive ion beam etching, should be possible to employ with the plasma environments disclosed by employing the reaction chamber shown in FIG. 1 after corresponding electrical changes have been implemented. For example, the RF coupling circuit 54 may be connected to the substrate table 27, while the electrode 25 may be connected to ground. Commercial systems that are available for the employment of this disclosure include versions of system 8001 marketed by LFE Corporation of Waltham, Mass., designated for plasma etching of aluminum and aluminum alloys. That system is comprised of a series of five reactors, each one similar to the one described above. Other commercially available systems include the PFS/PDE/PDS 501P and 1002P marketed by LFE Corporation for plasma etching of polysilicon and other silicon-containing films. These systems are comprised of an internal planar electrode configuration for the simultaneous etching of a plurality of substrates.

I claim:

1. Process for selectively etching polysilicon material comprising the steps of:
   (a) placing polysilicon material within a reactor chamber, and
   (b) exposing said polysilicon material within the chamber to a gas plasma at a pressure between 50

TABLE I

| Gas | Press. (μHg) | RF Power Density (w/cm²) | | | | Poly Si Etch Rate (A/min) | | | | SiO₂ Etch Rate (A/min.) | Selectivity* |
| --- | --- | --- | --- | --- | --- | --- | --- | --- | --- | --- | --- |
| Freon 13 | 50 | 0.24 | 0.98 | 1.47 | 1.96 | 300 | 900 | 1900 | 2200 | 275 | 8 |
| (CF₃Cl) | 100 | 0.24 | 0.98 | 1.47 | 1.96 | 700 | 2000 | 3600 | 4300 | 660 | 6.5 |
| | 150 | 0.24 | 0.98 | 1.47 | 1.96 | 1100 | 4000 | 6200 | 6800 | 1445 | 4.7 |
| Freon 12 | 50 | 0.24 | 0.98 | 1.47 | 1.96 | 500 | 1600 | 3100 | 4200 | 247 | 17 |
| (CF₂Cl₂) | 100 | 0.24 | 0.98 | 1.47 | 1.96 | 1100 | 3300 | 4700 | 5700 | 455 | 12.5 |
| | 150 | 0.24 | 0.98 | 1.47 | 1.96 | 1700 | 5300 | 6800 | 7600 | 755 | 9.8 |
| Freon 11 | 50 | 0.24 | 0.98 | 1.47 | 1.96 | 800 | 2500 | 4800 | 5700 | 178 | 32 |
| (CFCl₃) | 100 | 0.24 | 0.98 | 1.47 | 1.96 | 1700 | 5200 | 5800 | 6700 | 257 | 26 |
| | 150 | 0.24 | 0.98 | 1.47 | 1.96 | 2200 | 6400 | 7400 | 8400 | 400 | 21 |

RF electrode diameter: 4.5"
Electrode-to-wafer table distance 1.25"
*Selectivity defined as the average etch rate ratio Polysilicon-to-SiO₂
The columns of etch rates correspond in position to the columns of power density so that, for example, the first column in etch rates corresponds to the first column in power density.

Table I represents the etching results obtained with Freon 11, 12 and 13 plasmas. As illustrated, both the etching rate for polysilicon and the selectivity of etching polysilicon versus silicon oxide improves dramatiand 150 microns Hg for etching, wherein said gas plasma consists essentially of RF discharge CFCl₃.

2. A process in accordance with claim 1 wherein said polysilicon material is a polysilicon layer over silicon oxide.

3. A process in accordance with claim 1 wherein power is supplied to said gas plasma at a rate between 0.2 and 2 watts per centimeter squared of power density.

4. A process in accordance with claim 1 wherein a carrier gas of helium is added to the etchant gas.

5. A process for fabrication of a semiconductor device having a polysilicon layer and a silicon oxide layer including the step of preferential etching of said polysilicon layer, where said preferential etching of said polysilicon layer comprises the steps of,
 (a) placing said semiconductor device within a reactor chamber,
 (b) exposing said semiconductor device within said reaction chamber to etchant gas consisting essentially of $CFCl_3$ at a pressure between 50 and 150 microns Hg.

6. A process in accordance with claim 5 wherein said polysilicon layer is to be etched with a line pattern characterized by widths of less than 4 microns and wherein said plasma is supplied power at a rate of between 0.2 and 2 watts per centimeter square of power density.

* * * * *